United States Patent
Liu

(10) Patent No.: US 11,894,216 B2
(45) Date of Patent: Feb. 6, 2024

(54) METHOD OF PREPARING AND ANALYZING THIN FILMS

(71) Applicant: Yangtze Memory Technologies Co., Ltd., Hubei (CN)

(72) Inventor: Jing Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 410 days.

(21) Appl. No.: 17/116,610

(22) Filed: Dec. 9, 2020

(65) Prior Publication Data
US 2022/0028655 A1   Jan. 27, 2022

Related U.S. Application Data

(63) Continuation of application No. PCT/CN2020/104336, filed on Jul. 24, 2020.

(51) Int. Cl.
*H01J 37/305* (2006.01)
*G01N 1/32* (2006.01)

(52) U.S. Cl.
CPC ............ *H01J 37/3056* (2013.01); *G01N 1/32* (2013.01); *H01J 2237/31745* (2013.01)

(58) Field of Classification Search
CPC ......... H01J 37/3056; H01J 2237/31713; H01J 2237/31745; H01J 2237/31749; G01N 1/32

See application file for complete search history.

(56) References Cited

U.S. PATENT DOCUMENTS 6,039,000 A * 3/2000 Libby ................. H01J 37/3005
                                                        250/398
6,042,736 A * 3/2000 Chung ...................... G01N 1/32
                                                         216/60
6,194,720 B1   2/2001 Li et al.
(Continued)

FOREIGN PATENT DOCUMENTS

CN         102269772 A      12/2011
CN         103196713 A       7/2013
(Continued)

OTHER PUBLICATIONS

Steve Reyntjens, et al., "A Review of Focused Ion Beam Applications in Microsystem Technology" Abstract, Journal Micromechechanics and Microengineering. vol. 11, No. 4, Jul. 2001, 3 pages.
(Continued)

*Primary Examiner* — Sean M Luck
(74) *Attorney, Agent, or Firm* — Oblon, McClelland, Maier & Neustadt, L.L.P.

(57) ABSTRACT

Aspects of the disclosure provide a method of preparing a focused ion beam (FIB) sample and analyzing the sample in an electron microscope system. The method can include forming, over a substrate, a target film having a thickness of less than a threshold corresponding to a limit for FIB requirements, and forming a supporting film over the target film. The method can also include obtaining a FIB sample that includes a portion of the target film and a portion of the supporting film and. The method can further include analyzing the obtained portion of the target film in an electron microscope system.

20 Claims, 3 Drawing Sheets

(56) References Cited

U.S. PATENT DOCUMENTS

| | | | |
|---|---|---|---|
| 6,576,900 B2* | 6/2003 | Kelly | G01N 1/32 216/2 |
| 8,859,963 B2 | 10/2014 | Moriarty et al. | |
| 8,912,490 B2* | 12/2014 | Kelley | G01N 1/32 250/311 |
| 9,111,720 B2 | 8/2015 | Kelley et al. | |
| 9,279,752 B2 | 3/2016 | Moriarty et al. | |
| 10,101,246 B2* | 10/2018 | Chen | G01N 1/28 |
| 10,410,829 B1* | 9/2019 | Porter | H01J 37/305 |
| 2006/0065829 A1 | 3/2006 | Lu | |
| 2007/0158566 A1* | 7/2007 | Ikeda | G01N 1/32 250/311 |
| 2012/0217152 A1* | 8/2012 | Miller | H01J 37/3053 204/192.34 |
| 2013/0143412 A1 | 6/2013 | Moriarty et al. | |
| 2013/0214468 A1* | 8/2013 | Giannuzzi | G01N 1/00 156/60 |
| 2014/0284307 A1* | 9/2014 | Asahata | H01J 37/3056 216/60 |
| 2015/0102009 A1 | 4/2015 | Moriarty et al. | |
| 2015/0179402 A1 | 6/2015 | Kelley et al. | |
| 2015/0369710 A1* | 12/2015 | Fuller | H01J 37/317 427/595 |
| 2016/0035540 A1* | 2/2016 | Kruger | G01N 1/286 250/492.21 |
| 2016/0356729 A1 | 12/2016 | Bauer | |

FOREIGN PATENT DOCUMENTS

| | | |
|---|---|---|
| CN | 104241156 A | 12/2014 |
| CN | 105510092 A | 4/2016 |
| CN | 106289892 A | 1/2017 |
| CN | 107271230 A | 10/2017 |
| CN | 110530700 A | 12/2019 |
| CN | 110553885 A | 12/2019 |
| CN | 110579495 A | 12/2019 |
| JP | 3321533 B2 | 9/2002 |

OTHER PUBLICATIONS

Chinese Office Action and Search Report dated Mar. 1, 2023 in the Chinese Patent Application No. 202080001723.7, 11 pages.
International Search Report dated Apr. 29, 2021 in PCT/CN2020/104336 filed Jul. 24, 2020, 5 pages.

* cited by examiner

METHOD OF PREPARING AND ANALYZING THIN FILMS

RELATED APPLICATION

This application is a bypass continuation of International Application No. PCT/CN2020/104336, filed on Jul. 24, 2020. The entire disclosure of the prior application is hereby incorporated by reference in its entirety.

BACKGROUND

As semiconductors continue to shrink, thin films, for example sub-60 nm films, are becoming increasingly important for various microelectronic devices. Many relevant properties of such thin films are dictated by their microstructure. However, characterizing thin film microstructure can be complicated for several reasons, such as sample preparation and technique limitations.

For example, techniques for analyzing thin film microstructure often impose stringent requirements on the size and shape of a sample. Although focused ion beam (FIB) has proven successful in obtaining microscale thin slices and needles, FIB itself can be challenging and time-consuming. Particularly, such microscale samples can be fragile and can break or shatter during FIB etching or milling.

Further, many thin film analytic techniques have intrinsic limitations. For example, transmission Kikuchi diffraction (TKD) can be used to characterize nanomaterials with a spatial resolution of a few nanometers. This technique uses electron signals (Kikuchi patterns) to provide information about crystal phases, orientation, deformation, and the like. However, TKD suffers from weak Kikuchi patterns when a sample is too thin to generate enough diffraction signals.

SUMMARY

Aspects of the disclosure provide a method of preparing a focused ion beam (FIB) sample and analyzing the sample in an electron microscope system.

According to a first aspect, a method of preparing a FIB sample is provided. The method can include forming, over a substrate, a target film having a thickness of less than a threshold corresponding to a limit for FIB requirements. The method can also include forming a supporting film over the target film. The target film can be a metal material, and the supporting film can be a different material from the target film. In some embodiments, the target film can be tungsten or copper, and the supporting film can be silicon oxide.

The method can further include obtaining the FIB sample that includes a portion of the target film and a portion of the supporting film. A FIB lift-out process can be performed to remove the portion of the target film and the portion of the supporting film from the substrate. The portion of the supporting film can be reduced to a predetermined thickness. After obtaining the FIB sample, in some embodiments, the portion of the tungsten film can have a thickness of less than 30 nm, and the portion of the silicon oxide film can have a predetermined thickness between 10 and 40 nm. Lateral dimensions of the portion of the target film can be between 1 µm×1 µm and 15×15 µm.

In some embodiments, the method can further include forming a buffer layer over the supporting film prior to obtaining the FIB sample so that a portion of the buffer layer will remain on the portion of the supporting film during the FIB lift-out process and then be removed, prior to reducing the portion of the supporting film to a predetermined thickness, so as to protect the portion of the supporting film. The buffer layer can be made of a different material from the supporting film. In some embodiments, the buffer layer can be tungsten and have a thickness of at least 1000 nm.

According to a second aspect of the disclosure, a method of analyzing a sample in an electron system is provided. The method can include forming, over a substrate, a target film having a thickness of less than a threshold corresponding to a limit for FIB requirements. The method can also include forming a supporting film over the target film. The target film can be a metal material. The supporting film can be made of an electron transparent material that is different from the target film, and the electron transparent material can allow an electron beam to pass through and enhance electron signals. In some embodiments, the target film can be tungsten or copper, and the supporting film can be silicon oxide.

The method can further include obtaining the FIB sample that includes a portion of the target film and a portion of the supporting film. A FIB lift-out process can be performed to remove the portion of the target film and the portion of the supporting film from the substrate. The portion of the target film can be a plane view section, and the portion of the supporting film can be further reduced to a predetermined thickness. After obtaining the FIB sample, in some embodiments, the portion of the tungsten film can have a thickness in the range of less than 30 nm, and the portion of the silicon oxide film can have a predetermined thickness between 10 and 40 nm. Lateral dimensions of the portion of the target film can be between 1 µm×1 µm and 15 µm×15 µm.

The method can further include analyzing the obtained portion of the target film in an electron microscope system. In some embodiments, the obtained portion of the target film can be analyzed by transmission Kikuchi diffraction with the obtained portion of the target film facing a detector and the remaining supporting film facing an electron gun.

In some embodiments, the method can further include forming a buffer layer over the supporting film prior to obtaining the FIB sample so that a portion of the buffer layer will remain on the portion of the supporting film during the FIB lift-out process and then be removed, prior to reducing the portion of the supporting film to a predetermined thickness, so as to protect the portion of the supporting film. The buffer layer can be made of a different material from the supporting film. In some embodiments, the buffer layer can be tungsten and have a thickness of at least 1000 nm.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
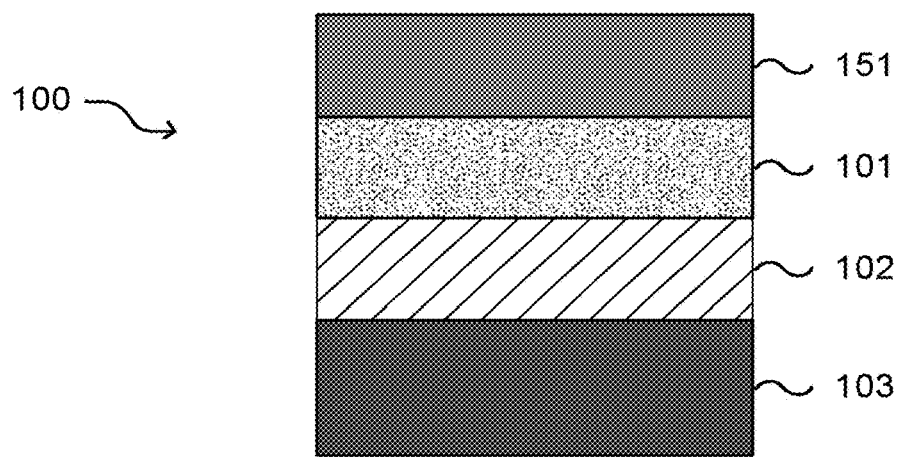
FIGS. 1A, 1B, and 1C are cross-sectional views of a semiconductor device at various intermediate steps of sample preparation in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a method of preparing and analyzing thin films, for example a sub-60 nm sample. The method can include forming a target film over a substrate, forming a supporting film over the target film, obtaining a portion of the target film and a portion of the supporting film from the substrate, and analyzing the obtained portion of the target film in an electron microscope system. The supporting film can not only provide mechanical support to the target film during sample preparation, but also enhance electron signal intensity in an electron microscope system, such as backscattered electron (BSE) signals in a TKD test.

Figure 1B:
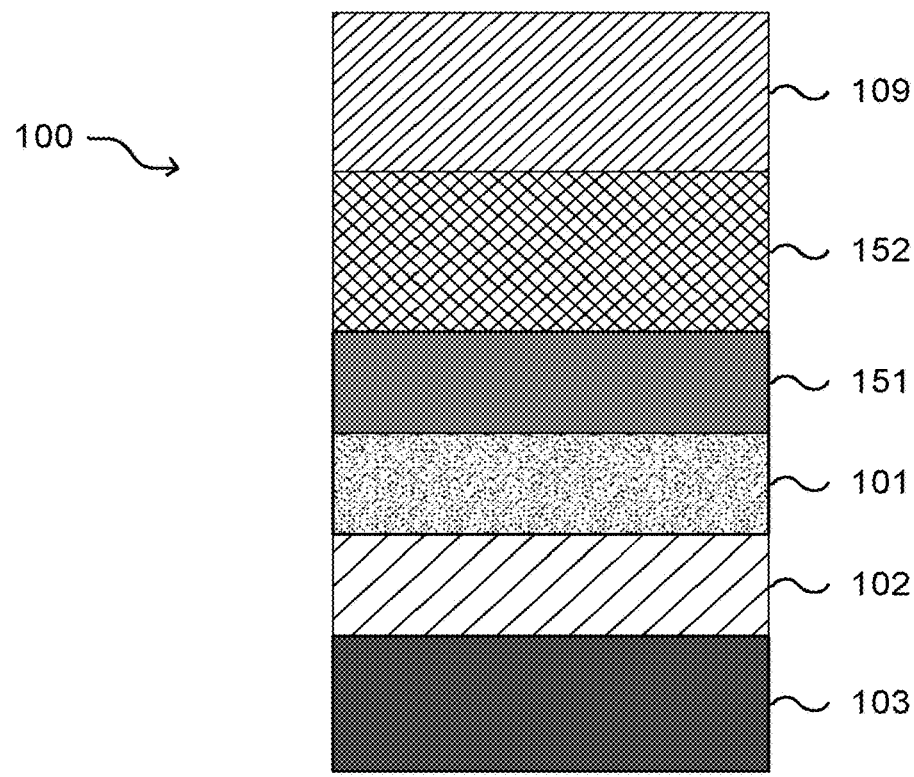
Figure 1C:
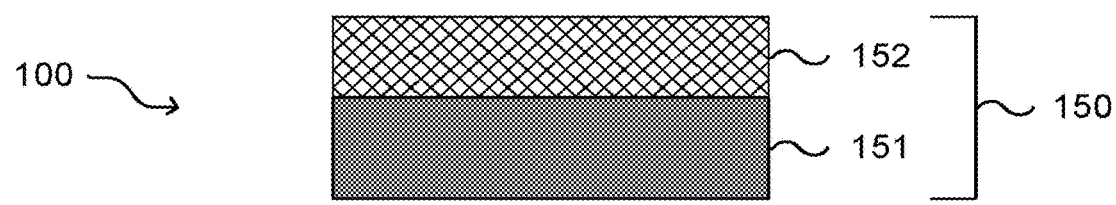

FIGS. 1A, 1B, and 1C are cross-sectional views of a semiconductor device 100 at various intermediate steps of sample preparation, in accordance with exemplary embodiments of the disclosure. The device 100 can refer to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

As shown in FIG. 1A, the device 100 can include a target film 151, a first layer 101 below the target film 151, a second layer 102 below the first layer 101, and a substrate 103 below the second layer 102. In an example, the target film 151 can be a metal film, such as tungsten with a thickness of less than 30 nm or copper with a thickness of less than 40 nm. The first layer 101 can be an adhesion layer, such as titanium nitride, with a thickness of a few nanometers. The second layer 102 can be an arbitrary material with an arbitrary thickness. The substrate 103 can be any suitable substrate, such as silicon. The target film 151, the first layer 101, and the second layer 102 can be formed by any technique, such as chemical vapor deposition or physical vapor deposition. Note that in some embodiments, the target film 151 can be directly on the substrate 103 with no film in between (not shown).

FIG. 1B shows the device 100 in FIG. 1A after the device 100 is subjected to two deposition processes. As shown, a supporting film 152 can be deposited over the target film 151 to provide mechanical support to the target film 151. The supporting film 152 can be made of a different material from the target film 151. For example, the supporting film 152 can be silicon oxide with a thickness of at least 1000 nm and deposited by any technique, such as chemical vapor deposition.

As further shown in FIG. 1B, a buffer layer 109 can also be deposited over the supporting film 152 to protect the supporting film 152 for the sack of FIB requirement. The buffer layer 109 can be made of a different material from the supporting film 152. For example, the buffer layer 109 can be tungsten with a thickness of at least 1000 nm and deposited by any technique. In some embodiments, the buffer layer 109 may not be necessary.

FIG. 1C is a cross-sectional view of the device 100 in FIG. 1B after the device 100 undergoes a lift-out process and a thinning process. As shown, numerous layers can be removed so that a portion of the target film 151 and a portion of the supporting film 152 can be extracted from the device 100 of FIG. 1B. Specifically, by using a technique, such as a focused ion beam (FIB) lift-out process (also known as a FIB lift-off process), the first layer 101, the second layer 102, and the substrate 103 can be removed from one side of the portion of the target film 151. After the lift-out process, a portion of the supporting film 152 and a portion of the buffer layer 109 can remain on and fully cover the other side of the obtained portion of the target film 151 (not shown). The obtained portion of the target film 151 can have lateral dimensions between 1 μm×1 μm and 15 μm×15 μm, and the portion of the supporting film 152 can provide mechanical support to the obtained portion of the target film 151.

Next, a technique, such as a FIB milling process, can be used to remove the portion of the buffer layer 109 and reduce a thickness of the portion of the supporting film 152 to a predetermined thickness to obtain a sample 150. As a result, the sample 150 can include the obtained portion of the target film 151 and the remaining portion of the supporting film 152.

In an example, the target film 151 can be tungsten. The thickness of the tungsten film in the sample 150 can be thin, for example, around 10-30 nm. The supporting film 152 can be silicon oxide and have a thickness in the sample 150, for example, between 30 nm and 40 nm. Further, the sample can have lateral dimensions, for example, between 1 μm×1 μm and 15 μm×15 μm.

Figure 2:
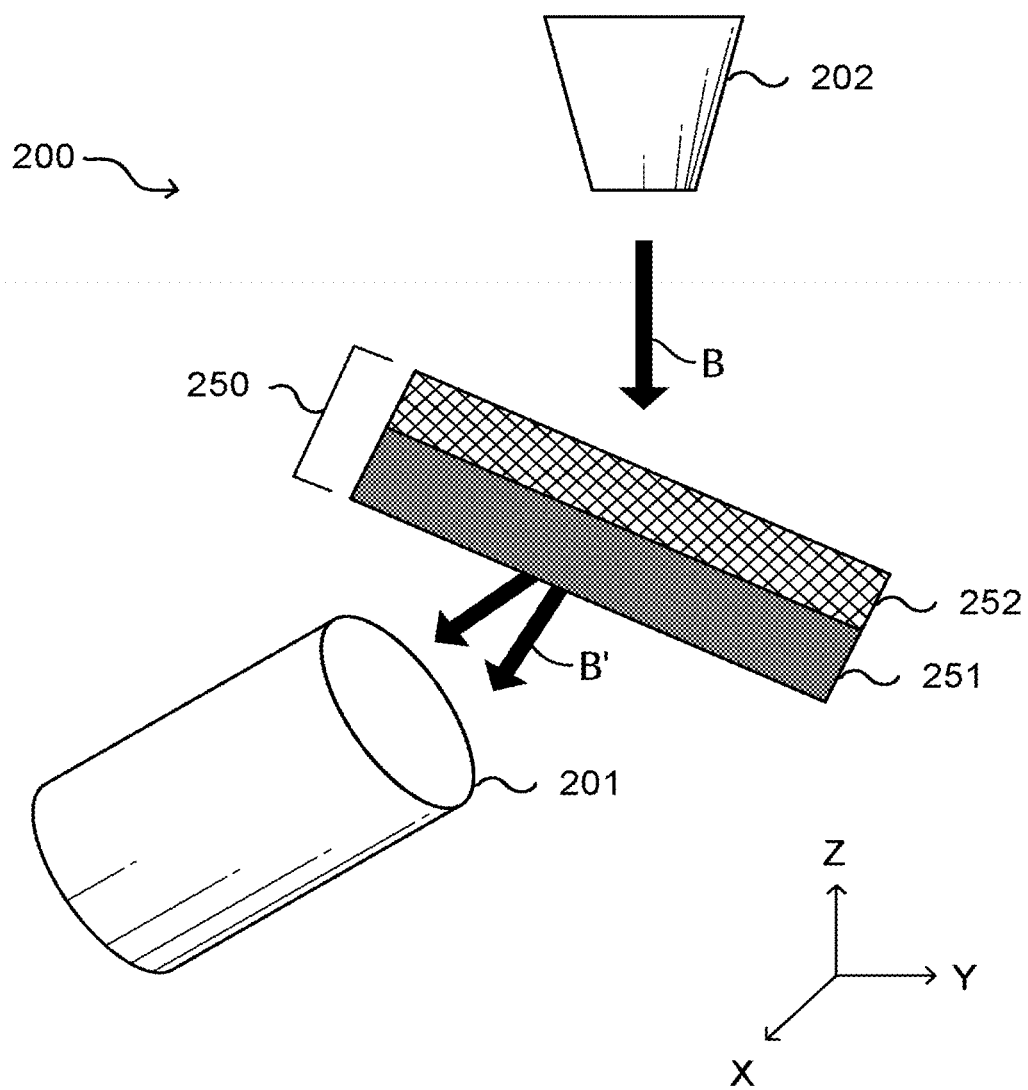
FIG. 2 is a cross-sectional view of an exemplary embodiment in which a sample is analyzed in an electron microscope system.

FIG. 2 is a cross-sectional view of an exemplary embodiment, in which a sample 250 is analyzed in an electron microscope system 200. As shown in FIG. 2, the sample 250 can correspond to the sample 150 in FIG. 1C. Since the example embodiment of the sample 250 in FIG. 2 is similar to the example embodiment of the sample 150 in FIG. 1C, the explanation will be given with emphasis placed upon differences. The sample 250 can have a target film 251 and a supporting film 252, corresponding to the obtained portion of the target film 151 and the remaining supporting film 152 in FIG. 1C, respectively. The target film 251 can be a plane view section. Additionally, the supporting film 252 can be an electron transparent material that allows electrons to pass through and enhance electron signals.

Still in FIG. 2, the electron microscope system 200 can be a scanning electron microscope (SEM) that includes an electron gun 202 and a detector 201. A vector B can represent an incident vector of an electron beam from the electron gun 202 while a vector(s) B' can represent a vector(s) of an electron beam that has passed through the sample 250, or are otherwise scattered by the sample 250, and is received by the detector 201. The detector 201 can detect the electron beam B' and generate transmission Kikuchi diffraction (TKD) patterns, which can be analyzed to provide information about the sample 250's crystal phases, orientation, deformation, and the like. As shown, the sample 250 can be arranged so that the supporting film 252 faces the electron gun 202 and the target film 251 faces the detector 201. As a result, the sample 250's interaction with the electron beam B of the electron gun 202 can be enhanced to achieve stronger Kikuchi diffraction patterns.

Figure 3:
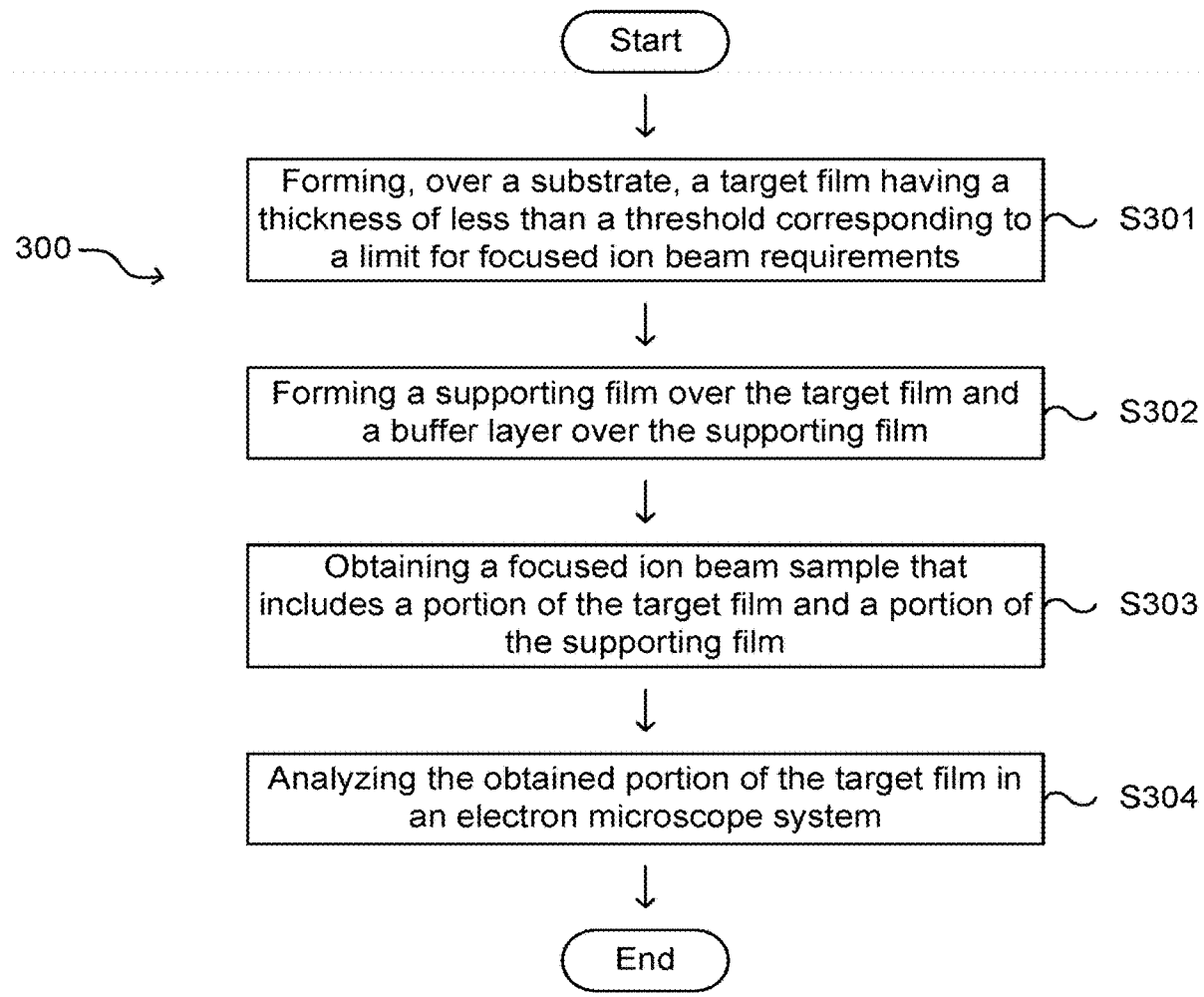
FIG. 3 is a flow chart of an exemplary process for preparing and analyzing a sample in accordance with embodiments of the disclosure.

FIG. 3 is a flow chart of an exemplary process 300 for preparing and analyzing a sample, in accordance with embodiments of the disclosure. The process 300 begins with step S301 where a target film can be formed over a substrate. The target film can have a thickness of less than a threshold corresponding to a limit for FIB requirements. Specifically, the threshold thickness refers to a thickness below which the target film can be fragile and break or shatter during FIB processing. Therefore, the threshold thickness can be unique for each material. For example, the target film can be a metal material, such as tungsten with a thickness of less than 30 nm and formed by any technique, such as chemical vapor deposition. Alternatively, the target film can be copper with a thickness of less than 40 nm and formed by any technique, such as physical vapor deposition. Additionally, in some embodiments, the first layer can be disposed separate from the substrate by numerous layers. For example, a first layer can be disposed below the target film, and a second layer can be sandwiched between the first layer and the substrate.

The process 300 then proceeds to step S302 where a supporting film can be formed on the target film. The supporting film can provide mechanical support to the target film. The supporting film can be made of a different material from the target film. For example, the supporting film can be silicon oxide, with a thickness of at least 1000 nm, and formed by any technique, such as chemical vapor deposition. Further, a buffer layer can be formed over the supporting film to protect the supporting film. The buffer layer can be made of a different material from the supporting film. For example, the buffer layer can be tungsten, with a thickness of at least 1000 nm, and formed by any technique, such as chemical vapor deposition. In some embodiments, the buffer layer may not be necessary.

At step S303 of the process 300, a FIB sample can be obtained from the substrate. The FIB sample can include a portion of the target film and a portion of the supporting film. Specifically, the first layer, the second layer, and the substrate can be removed from one side of the portion of the target film by using a technique, such as a FIB lift-out process. After the lift-out process, a portion of the supporting film and a portion of the buffer layer can remain on and fully cover the other side of the obtained portion of the target film. Subsequently, a technique, such as a FIB milling process, can be used to remove the portion of the buffer layer and reduce a thickness of the portion of the supporting film to a predetermined thickness to obtain the FIB sample. As a result, the sample can include the obtained portion of the target film and the remaining portion of the supporting film.

In an example, the target film, the supporting film, and the buffer layer can be tungsten, silicon oxide, and tungsten, respectively. The obtained portion of the tungsten film can be thin, for example, around 10-30 nm and have lateral dimensions between 1 µm×1 µm and 15 µm×15 µm. A tungsten film of such small dimensions can be fragile and therefore break or shatter during FIB processing. The silicon oxide film, however, can provide mechanical support to the tungsten film. Further, the predetermined thickness of the remaining silicon oxide film in the sample can be in the range of 10-50 nm. A FIB milling process can etch away the entire silicon oxide film quickly, but a tungsten buffer layer can protect the silicon oxide film from being removed completely.

The process 300 then proceeds to step S304 where the obtained portion of the target film can be analyzed in an electron microscope system. For example, transmission Kikuchi diffraction patterns of the obtained portion of the target film can be obtained in a scanning electron microscope (SEM) where the obtained portion of the target film is arranged to face a detector of the SEM and the remaining supporting film is arranged to face an electron gun of the SEM. In an example where the obtained portion of the target film in the sample is a 10-nm tungsten film which may be too thin to generate Kikuchi diffraction patterns, the remaining supporting film can enhance the diffraction signals.

It should be noted that additional steps can be provided before, during, and after the process 300, and some of the steps described can be replaced, eliminated, or performed in a different order for additional embodiments of the process 300. For example, numerous layers can be formed between the target film and the substrate. The buffer layer may not be necessary in some embodiments.

The various embodiments described herein offer several advantages. For example, in the disclosed method, the obtained portion of the target film can have a thickness of around 10-3 nm and lateral dimensions between 1 µm×1 µm and 15 µm×15 µm. Despite being relevant in state-of-the-art semiconductor devices, such dimensions can render a film fragile and prone to break or shatter during sample preparation. In the disclosed method, nevertheless, the supporting film can provide mechanical support to and keep the integrity of the obtained portion of the target film. Moreover, transmission Kikuchi diffraction (TKD) techniques can suffer from weak electron signals when a film is too thin, for example 10 nm. The supporting film, however, can be an electron transparent material to allow electrons to pass through and enhance electron signals.

By using the disclosed method, FIB samples of effective areas larger than 2 µm×2 µm have been obtained for thin metal films between 10 nm and 30 nm, and strong electron diffraction signals have been obtained from those FIB samples. Particularly, a test result of 80% calibration rate before noise reduction has been obtained for a step size of 5 nm and an area of 2 µm×2 µm. By analyzing thin films with TKD, various microstructural information such as crystal grains, boundaries, and orientation can be obtained to probe the microscopic mechanism of metal thin film nucleation, growth, crystallization, recrystallization, and so on. The disclosed techniques can significantly facilitate FIB sample preparation and enhance TKD signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of preparing a focused ion beam (FIB) sample, comprising:
   forming, over a planar substrate, a target film having a thickness of less than a threshold corresponding to a limit for FIB requirements;
   forming a supporting film over the target film;
   forming a buffer layer over the supporting film, wherein the buffer layer, the supporting film, the target film and the planar substrate are stacked in a direction perpendicular to the planar substrate; and
   after forming the supporting film and forming the buffer layer, obtaining the FIB sample that includes a portion of the target film and a portion of the supporting film.

2. The method of claim 1, wherein obtaining the FIB sample further comprises:
   preforming a FIB lift-out process to remove the portion of the supporting film and the portion of the target film from the planar substrate;
   reducing the portion of the supporting film to a predetermined thickness.

3. The method of claim 2, wherein:
   a portion of the buffer layer will remain on the portion of the supporting film during the FIB lift-out process and then be removed, prior to reducing the portion of the supporting film to a predetermined thickness, so as to protect the portion of the supporting film.

4. The method of claim 3, wherein the buffer layer is made of a different material from the supporting film.

5. The method of claim 4, wherein the buffer layer is made of tungsten having a thickness of at least 1000 nm.

6. The method of claim 1, wherein after obtaining the FIB sample:
   the portion of the target film has a thickness in the range of less than 30 nm;
   the portion of the supporting film has a predetermined thickness between 10 and 50 nm; and
   lateral dimensions of the portion of the target film are between 1 μm×1 μm and 15 μm×15 μm.

7. The method of claim 1, wherein:
   the target film is a metal material; and
   the supporting film is a different material from the target film.

8. The method of claim 7, wherein:
   the target film is tungsten or copper.

9. The method of claim 8, wherein:
   the supporting film is silicon oxide.

10. A method of analyzing a sample in an electron microscope system, comprising:
    forming, over a planar substrate, a target film having a thickness of less than a threshold corresponding to a limit for FIB requirements;
    forming a supporting film over the target film;
    forming a buffer layer over the supporting film, wherein the buffer layer, the supporting film, the target film and the planar substrate are stacked in a direction perpendicular to the planar substrate;
    after forming the supporting film and forming the buffer layer, obtaining a FIB sample that includes a portion of the target film and a portion of the supporting film; and
    analyzing the obtained portion of the target film in an electron microscope system.

11. The method of claim 10, wherein obtaining the FIB sample further comprises:
    preforming a FIB lift-out process to remove the portion of the target film and the portion of the supporting film from the planar substrate; and
    reducing the portion of the supporting film to a predetermined thickness.

12. The method of claim 11, wherein:
    a portion of the buffer layer will remain on the portion of the supporting film during the FIB lift-out process and then be removed, prior to reducing the portion of the supporting film to a predetermined thickness, so as to protect the portion of the supporting film.

13. The method of claim 12, wherein the buffer layer is made of a different material from the supporting film.

14. The method of claim 13, wherein the buffer layer is made of tungsten having a thickness of at least 1000 nm.

15. The method of claim 11, wherein the obtained portion of the target film is a plane view section of the target film.

16. The method of claim 10, wherein analyzing the obtained portion of the target film in an electron microscope system further comprises:
    analyzing the obtained portion of the target film by transmission Kikuchi diffraction with the obtained portion of the target film facing a detector and the remaining supporting film facing an electron gun.

17. The method of claim 10, wherein after obtaining the FIB sample:
    the portion of the target film has a thickness in the range of less than 30 nm;
    the portion of the supporting film has a predetermined thickness between 10 and 50 nm; and
    lateral dimensions of the portion of the target film are between 1 μm×1 μm and 15 μm×15 μm.

18. The method of claim 10, wherein:
    the target film is a metal material; and
    the supporting film is made of an electron transparent material that is different from the target film, the electron transparent material allowing an electron beam to pass through and enhancing electron signals.

19. The method of claim 18, wherein:
    the target film is tungsten or copper.

20. The method of claim 19, wherein:
    the supporting film is silicon oxide.

* * * * *